United States Patent
Sasagawa et al.

(10) Patent No.: US 9,373,708 B2
(45) Date of Patent: *Jun. 21, 2016

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shinya Sasagawa, Chigasaki (JP); Hitoshi Nakayama, Atsugi (JP); Hiroshi Fujiki, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/718,763

(22) Filed: May 21, 2015

(65) Prior Publication Data

US 2015/0255584 A1    Sep. 10, 2015

Related U.S. Application Data

(63) Continuation of application No. 13/466,664, filed on May 8, 2012, now Pat. No. 9,093,539.

(30) Foreign Application Priority Data

May 13, 2011   (JP) .................................. 2011-108666

(51) Int. Cl.
*H01L 29/786* (2006.01)
*H01L 21/336* (2006.01)
(Continued)

(52) U.S. Cl.
CPC ...... *H01L 29/66969* (2013.01); *H01L 27/1225* (2013.01); *H01L 29/7869* (2013.01);
(Continued)

(58) Field of Classification Search
CPC ............ H01L 29/7869; H01L 29/6696; H01L 21/02565; H01L 21/02554; H01L 21/02664; H01L 21/324; H01L 27/1225
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    1933293 A    6/2008
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2204, vol. 85, No. 13, pp. 2541-2543.

(Continued)

*Primary Examiner* — Victor A Mandala
*Assistant Examiner* — Regan J Rundio
(74) *Attorney, Agent, or Firm* — Robinson Intellectual Property Law Office; Eric J. Robinson (57) ABSTRACT

To establish a processing technique in manufacture of a semiconductor device including an In—Sn—Zn—O-based semiconductor. An In—Sn—Zn—O-based semiconductor layer is selectively etched by dry etching with the use of a gas containing chlorine such as $Cl_2$, $BCl_3$, $SiCl_4$, or the like. In formation of a source electrode layer and a drain electrode layer, a conductive layer on and in contact with the In—Sn—Zn—O-based semiconductor layer can be selectively etched with little removal of the In—Sn—Zn—O-based semiconductor layer with the use of a gas containing oxygen or fluorine in addition to a gas containing chlorine.

14 Claims, 5 Drawing Sheets

(51) Int. Cl.
*H01L 21/36* (2006.01)
*H01L 29/66* (2006.01)
*H01L 27/12* (2006.01)
*H01L 21/02* (2006.01)

(52) U.S. Cl.
CPC ..... *H01L29/78696* (2013.01); *H01L 21/02554* (2013.01); *H01L 21/02565* (2013.01); *H01L 21/02631* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,753,549 B2 | 6/2004 | Korenari |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,767,106 B2 | 8/2010 | Chang |
| 7,915,075 B2 | 3/2011 | Suzawa et al. |
| 8,748,878 B2 | 6/2014 | Yamaguchi et al. |
| 8,753,548 B2 | 6/2014 | Yano et al. |
| 8,871,119 B2 | 10/2014 | Yano et al. |
| 9,093,539 B2 * | 7/2015 | Sasagawa ........... H01L 29/7869 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236597 A1 | 9/2009 | Ye |
| 2009/0239335 A1 | 9/2009 | Akimoto et al. |
| 2009/0278122 A1 | 11/2009 | Hosono et al. |
| 2009/0278252 A1 | 11/2009 | Oikawa et al. |
| 2009/0280600 A1 | 11/2009 | Hosono et al. |
| 2010/0044713 A1 | 2/2010 | Miyaguchi et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0123136 A1 | 5/2010 | Lee et al. |
| 2010/0155716 A1 | 6/2010 | Cheong et al. |
| 2010/0163868 A1 | 7/2010 | Yamazaki et al. |
| 2010/0224878 A1 | 9/2010 | Kimura |
| 2010/0285632 A1 | 11/2010 | Inoue et al. |
| 2011/0012118 A1 | 1/2011 | Yamazaki et al. |
| 2011/0079777 A1 | 4/2011 | Akimoto |
| 2011/0095337 A1 | 4/2011 | Sato |
| 2011/0101336 A1 | 5/2011 | Yamazaki |
| 2011/0114943 A1 | 5/2011 | Yamazaki et al. |
| 2011/0117698 A1 | 5/2011 | Suzawa et al. |
| 2011/0212571 A1 | 9/2011 | Yamazaki et al. |
| 2012/0168743 A1 | 7/2012 | Lee et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-087301 A | 4/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| | | |
|---|---|---|
| JP | 2008-042067 A | 2/2008 |
| JP | 2010-123923 A | 6/2010 |
| JP | 2010-205987 A | 9/2010 |
| JP | 2010-232651 A | 10/2010 |
| WO | WO-2004/114391 | 12/2004 |
| WO | WO-2010/067571 | 6/2010 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 325, pp. 860-863.

Nomura.K et al., "Room-Temperature Fabrication of Transparent Flexible Thin-Film Transistor Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO) System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID DIGEST '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs"SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advance Materals), 2006, vol. 18, No. 3, pp. 339-342.

Tsuda.K et al., "Ultra Low Power Consumption Technologies for Mobile TFT-LCDs ", IDW '02 : Proceedings of The 9th International Display Workshops, Dec. 4, 2002, pp. 295-298.

Van de Walle C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H at al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 ; SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceeding of the 16th International Display Workshops, 2009, pp. 689-682.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YBFE2O4, and YB2FE3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors"Jpn. J. Appl. Phys. (Japanese Journal of Applied Physics) , vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H at al., "P-29:Modeling of Amorphous Oxide Semiconductor Thin Film Transistors and Subgap Density of States", SID Digest '08 : SID International Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F at al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S at al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M at al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Woo.J et al., "Dry Etching Characteristics of Zinc Oxide Thin Films in CL2-Based Plasma", Transaction on Electrical and Electronic Materials, Apr. 25, 2011, vol. 12, No. 2, pp. 60-63.

Fukumoto.E et al., "High-mobility oxide TFT for circuit integration of AMOLEDs", J. Soc. Inf. Display (Journal of the Society for Information Display), 2011, vol. 19, No. 12, pp. 867-872.

\* cited by examiner

METHOD FOR MANUFACTURING SEMICONDUCTOR DEVICE

BACKGROUND OF THE INVENTION

1. Field of the Invention

The present invention relates to a semiconductor device including an oxide semiconductor and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

2. Description of the Related Art

In recent years, a technique in which a thin film transistor (also referred to as TFT) is formed using an oxide semiconductor and is applied to an electronic device and the like has attracted attention. For example, a technique for forming a switching element of an image display device and the like using zinc oxide or an In—Ga—Zn—O based oxide semiconductor as an oxide semiconductor film is disclosed.

A typical technique for processing an oxide semiconductor is etching treatment. A technique for performing dry etching on an oxide semiconductor layer and a conductive layer covering the oxide semiconductor layer is disclosed in Patent Document 1.

In addition, a technique for performing dry etching on a conductive film containing $SnO_2$, $In_2O_3$, or ZnO as a main component with the use of hydrogen iodide has been disclosed in Patent Document 2.

REFERENCE

[Patent Document 1] Japanese Published Patent Application No. 2010-123923
[Patent Document 2] Japanese Published Patent Application No. H10-087301

SUMMARY OF THE INVENTION

An In—Ga—Zn—O-based oxide semiconductor layer can be etched by wet etching, whereas an oxide semiconductor layer containing $SnO_2$, $In_2O_3$, or ZnO (also referred to as In—Sn—Zn—O-based semiconductor, ITZO (registered trademark)) is difficult to etch by wet etching.

In addition, since wet etching is isotropic etching, it is unsuitable for miniaturization of elements. In addition, since a chemical solution is used in wet etching, there is a disadvantage in controllability. In contrast, dry etching has an advantage in miniaturization and controllability.

In view of the problems, an object of one embodiment of the present invention is to establish a processing technique in manufacture of a semiconductor device in which an In—Sn—Zn—O-based semiconductor is used.

Further, an object of one embodiment of the present invention is to provide a method for manufacturing a transistor with a novel structure formed by the processing technique.

An In—Sn—Zn—O-based semiconductor layer is selectively etched by dry etching with the use of a gas containing chlorine, such as $Cl_2$, $BCl_3$, or $SiCl_4$. Alternatively, the following mixed gas may be used as an etching gas: a gas containing chlorine to which a rare gas such as Ar is added, a gas containing chlorine to which oxygen is added, a gas containing chlorine to which a fluorine gas is added, a gas containing chlorine to which a hydrocarbon gas ($CH_4$) is added, a hydrocarbon gas to which a rare gas such as Ar is added, a hydrocarbon gas to which oxygen is added, a hydrocarbon gas to which a fluorine gas is added, and the like.

One embodiment of the present invention is a method for manufacturing a semiconductor device including the following steps of: forming an oxide semiconductor layer over an oxide insulating layer; selectively removing the oxide semiconductor layer by dry etching with the use of a gas containing chlorine so that part of the oxide insulating layer is exposed; forming a conductive layer over the oxide semiconductor layer; processing the conductive layer to form a source electrode layer and a drain electrode layer; forming a gate insulating layer over the source electrode layer and the drain electrode layer; and forming a gate electrode over the gate insulating layer. Note that the oxide semiconductor layer contains In, Sn, and Zn. A taper angle of an end portion of the oxide semiconductor layer can be greater than or equal to 10° and less than or equal to 70° after dry etching for processing the oxide semiconductor layer into an island shape.

Further, by the dry etching for processing the oxide semiconductor layer into an island shape, part of the oxide insulating layer is exposed. The thickness of the exposed region is smaller than that of a region overlapped with the oxide semiconductor layer. In other words, a transistor having the structure obtained by the dry etching for processing the oxide semiconductor layer into an island shape also has a characteristic.

Furthermore, by the dry etching for processing the oxide semiconductor layer into an island shape, the thickness of the oxide insulating layer is partly reduced. In view of the above, the oxide insulating layer before being etched is made thicker than the oxide insulating layer which is dry-etched for processing the oxide semiconductor layer into an island shape.

Further, when the conductive layer on and in contact with the In—Sn—Zn—O-based semiconductor layer is selectively etched to form a source electrode layer and a drain electrode layer, the selective etching is performed with little removal of the In—Sn—Zn—O-based semiconductor layer. In particular, in the case where a tungsten film or a molybdenum film is used for the conductive layer, a gas containing oxygen or fluorine is used in addition to a gas containing chlorine. Since the conductive layer can be selectively etched with little removal of the In—Sn—Zn—O-based semiconductor layer, the thickness of the In—Sn—Zn—O-based semiconductor layer in the film formation can be set to less than 30 nm. Further, when the conductive layer can be selectively etched with little removal of the In—Sn—Zn—O-based semiconductor layer, the amount of etching residue is small, so that the distance between a source electrode layer and a drain electrode layer of one transistor can be small, leading to miniaturization of the transistor.

The conductive layer on and in contact with the In—Sn—Zn—O-based semiconductor layer may be selectively etched by wet etching to form a source electrode layer and a drain electrode layer. The In—Sn—Zn—O-based semiconductor layer is removed little by wet etching and a sufficient selectivity of the In—Sn—Zn—O-based semiconductor layer to the conductive layer can be obtained, which is preferable.

Another embodiment of the present invention is a method for manufacturing a semiconductor device including the following steps of: forming an oxide semiconductor layer over an oxide insulating layer; selectively removing the oxide semiconductor layer by a first dry etching with the use of a gas containing chlorine so that part of the oxide insulating layer is exposed; forming a conductive layer over the oxide semiconductor layer; processing the conductive layer to form a source electrode layer and a drain electrode layer by a second dry etching with the use of a gas containing fluorine, oxygen, and chlorine; forming a gate insulating layer over the source electrode layer and the drain electrode layer; and forming a gate electrode over the gate insulating layer.

Another embodiment of the present invention is a method for manufacturing a semiconductor device having a bottom-gate transistor including the following steps of: forming a gate electrode; forming a gate insulating layer covering the gate electrode; forming an oxide semiconductor layer over the gate insulating layer; selectively removing the oxide semiconductor layer by a first dry etching with the use of a gas containing chlorine so that part of an oxide insulating layer is exposed; forming a conductive layer over the oxide semiconductor layer; and processing the conductive layer to form a source electrode layer and a drain electrode layer by a second dry etching with the use of a gas containing fluorine, oxygen, and chlorine.

In the above manufacturing methods, the oxide semiconductor layer contains In, Sn, and Zn. A taper angle of the end portion of the oxide semiconductor layer can be greater than or equal to 10° and less than or equal to 70° after the first dry etching for processing the oxide semiconductor layer into an island shape.

Further, in the above manufacturing methods, part of the oxide insulating layer exposed by the first dry etching has a smaller thickness than a region overlapped with the oxide semiconductor layer.

Furthermore, in the above manufacturing methods, part of the oxide insulating layer exposed by the second dry etching has a smaller thickness than regions overlapped with a source electrode layer and the drain electrode layer.

Note that a taper angle means an angle formed by a side surface of an end portion having a tapered shape and a flat surface of a substrate, and in this specification, an angle formed by a straight line connecting an upper end portion and a lower end portion in a cross section of a tapered end portion of an oxide semiconductor layer and a flat surface of a substrate or a surface of an oxide insulating layer.

In the above manufacturing methods, an inductively coupled plasma (ICP) etching apparatus is preferably used in the first dry etching and the second dry etching. Alternatively, a multi-spiral-coil ICP etching apparatus in which a coil is divided in order to lower the inductance of the coil or a spoke-type ICP etching apparatus in which a comb-like coil is provided in a circular flat plate can be used.

Further, the etching apparatus is not limited to an ICP etching apparatus, and for example, an RIE etching apparatus such as a parallel plate etching apparatus, an electron cyclotron resonance (ECR) etching apparatus, or a magnetron etching apparatus can be used for etching of an oxide semiconductor layer.

With the etching method described in one embodiment of the present invention, the end portion of the island-shaped oxide semiconductor layer can be tapered, so that step coverage of a film to be formed over the tapered island-shaped oxide semiconductor layer can be improved. With the favorable step coverage of the film over the tapered end portion, an insulating film formed over the oxide semiconductor layer can be made thin. In the case of a top-gate transistor, for example, a gate insulating layer covering the oxide semiconductor layer can be made thin.

Further, the distance between a source electrode layer and a drain electrode layer of one transistor can be small, so that a minute transistor can be manufactured.

DETAILED DESCRIPTION OF THE INVENTION

Hereinafter, embodiments of the present invention are described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, an example of a method for manufacturing a transistor which is one embodiment of the present invention will be described with reference to FIGS. 1A to 1D.

Figure 1A:
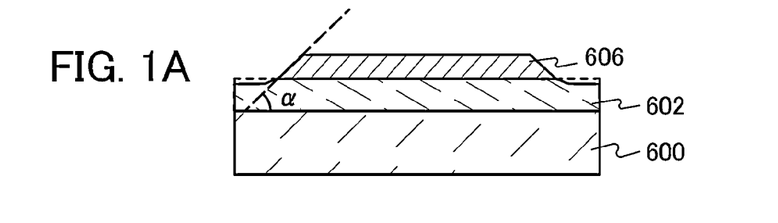
FIGS. 1A to 1D are cross-sectional views and a top view of one embodiment of the present invention.

First, a surface of a substrate 600 is preferably subjected to treatment for reducing impurities attaching to the surface of the substrate 600. As the treatment for reducing impurities, plasma treatment, heat treatment, or chemical treatment is given.

In this embodiment, plasma treatment is performed in an argon atmosphere. The plasma treatment is performed for three minutes in a sputtering apparatus and a bias power of 200 W (RF) is applied to the substrate 600 side.

Then, without exposure to the air after the treatment for reducing impurities, a base insulating film 602 is formed by a sputtering method, an evaporation method, a plasma-enhanced chemical vapor deposition method (PCVD method), a pulsed laser deposition method (PLD method), an atomic layer deposition method (ALD method), a molecular beam epitaxy method (MBE method), or the like.

It is preferable that the base insulating film 602 be formed by a sputtering method in an oxygen gas atmosphere at a substrate temperature higher than or equal to room temperature and lower than or equal to 200° C., preferably higher than or equal to 50° C. and lower than or equal to 150° C. Alternatively, a rare gas may be used instead of an oxygen gas. A thickness of the base insulating film 602 is greater than or equal to 100 nm and less than or equal to 1000 nm, preferably greater than or equal to 200 nm and less than or equal to 700 nm. Lower substrate temperature at the time of film formation, higher percentage of an oxygen gas in a film formation atmosphere, or a larger thickness of the base insulating film 602 leads to a larger amount of oxygen released at the time of performing heat treatment on the base insulating film 602. The concentration of hydrogen in a film can be more reduced by a sputtering method than by a PCVD method.

In this embodiment, without breaking the vacuum after the plasma treatment, a silicon oxide film which is the base insulating film 602 is formed to have a thickness of 300 nm. The silicon oxide film is formed using a sputtering apparatus with a power of 1500 W (RF) in an oxygen atmosphere. Note that the substrate temperature in the film formation is set at 100° C.

Then, the base insulating film 602 is subjected to planarization treatment so that the surface can have an average surface roughness (Ra) of 1 nm or less, preferably 0.3 nm or less, further preferably 0.1 nm or less. With the flat base insulating film, the state of an interface between the base insulating film and an oxide semiconductor film is favorable, whereby field-effect mobility can be increased and a variation in the threshold voltages can be reduced in the obtained transistor.

Note that, Ra is obtained by three-dimension expansion of center line average roughness that is defined by JIS B 0601 so as to be applied to a plane. The Ra can be expressed as an "average value of the absolute values of deviations from a reference surface to a specific surface" and is defined by the formula below.

$$Ra = \frac{1}{S_0} \int_{y_1}^{y_2} \int_{x_1}^{x_2} |f(x, y) - Z_0| \, dx \, dy \qquad \text{[FORMULA 1]}$$

In the above formula, $S_0$ represents an area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

In this embodiment, a surface of the base insulating film 602 is processed by chemical mechanical polishing (CMP) treatment to be planarized such that $R_a$ is about 0.2 nm. Note that in addition to the planarization treatment by CMP treatment, planarization treatment by plasma treatment may be performed.

Then, an oxide semiconductor film is formed by a sputtering method, an evaporation method, a PCVD method, a PLD method, an ALD method, an MBE method, or the like.

The oxide semiconductor film is formed preferably by a sputtering method in an oxygen gas atmosphere at a substrate temperature of 100° C. to 600° C. inclusive, preferably 150° C. to 550° C. inclusive, and further preferably 200° C. to 500° C. inclusive. The thickness of the oxide semiconductor film is more than or equal to 1 nm and less than or equal to 40 nm, and preferably more than or equal to 3 nm and less than or equal to 20 nm. As the substrate temperature in film formation is higher, the impurity concentration of the obtained oxide semiconductor film is lower. Further, the atomic arrangement in the oxide semiconductor film is ordered and the density thereof is increased, so that a polycrystal is readily formed. Furthermore, since an oxygen gas atmosphere is employed for the film formation, an unnecessary atom such as a rare gas is not contained, so that a polycrystal is readily formed. Note that a mixed gas atmosphere including an oxygen gas and a rare gas may be used. In that case, the percentage of an oxygen gas is higher than or equal to 30 vol. %, preferably higher than or equal to 50 vol. %, more preferably higher than or equal to 80 vol. %.

In this embodiment, an In—Sn—Zn—O film which is an oxide semiconductor film is formed with a thickness of 15 nm. It is preferable to use an In—Sn—Zn—O target of In:Sn:Zn=2:1:3, 1:2:2, 1:1:1, or 20:45:35 [atomic ratio]. When the oxide semiconductor film is formed using an In—Sn—Zn—O target having the atomic ratio, a polycrystal is readily formed.

The In—Sn—Zn—O film is formed using a sputtering apparatus with a power of 100 W (DC) in a mixed atmosphere of argon:oxygen=2:3 [volume ratio]. In this embodiment, an In—Sn—Zn—O target of In:Sn:Zn=1:1:1 [atomic ratio] is used as a target. Note that the substrate temperature in the film formation is set at 200° C.

Then, heat treatment is performed. The heat treatment is performed in a reduced pressure atmosphere, an inert atmosphere, or an oxidation atmosphere. By the heat treatment, the impurity concentration in the oxide semiconductor film can be reduced.

The heat treatment is preferably performed in such a manner that after heat treatment is performed in a reduced pressure atmosphere or an inert atmosphere, the atmosphere is switched to an oxidation atmosphere with the temperature maintained and heat treatment is further performed. When the heat treatment is performed in a reduced pressure atmosphere or an inert atmosphere, the impurity concentration in the oxide semiconductor film can be effectively reduced; however, oxygen vacancies are caused at the same time. By the heat treatment in the oxidation atmosphere, the caused oxygen vacancies can be reduced.

In this embodiment, heat treatment in a nitrogen atmosphere is first performed for one hour and heat treatment in an oxygen atmosphere is further performed for one hour with the temperature kept at 250° C., 450° C., or 650° C.

Next, the oxide semiconductor film is processed by a first photolithography process, so that an oxide semiconductor layer 606 is formed. In this embodiment, the oxide semiconductor film is etched by dry etching. As etching gasses, $BCl_3$ and $Cl_2$ are used. A dry-etching apparatus using a high-density plasma source such as ECR or ICP is used in order to improve the etching rate.

In this embodiment, with the use of an ICP etching apparatus and by appropriately adjusting the etching condition (e.g., the amount of power applied to a coil-shaped electrode, the amount of power applied to an electrode on a substrate side, or the electrode temperature on the substrate side), the oxide semiconductor film can be etched into a desired island shape.

In this embodiment, the conditions for dry-etching the 15-nm-thick In—Sn—Zn—O film are as follows: the amount of power applied to a coil-shaped electrode is 450 W; the amount of bias power applied to an electrode on the substrate 600 side is 100 W (RF); the flow rates of $BCl_3$ gas and $Cl_2$ gas introduced into the etching apparatus are 60 sccm and 20 sccm, respectively; the pressure is 1.9 Pa; and the substrate temperature is 70° C. The time for etching may be determined in consideration of the etching rate and the thickness of the In—Sn—Zn—O film. The etching rate of the In—Sn—Zn—O film under these etching conditions is 24.1 nm/min.

Under these etching conditions, the base insulating film 602 is also etched and is partly thin as illustrate in FIG. 1A. Note that it is possible not to make the base insulating film 602 thin by adjusting the etching conditions or changing the etching apparatus. In addition, by adjusting the etching conditions, the taper angle α of the end of island-shaped film can be larger than or equal to 10° and smaller than or equal to 70°.

Figure 1B:
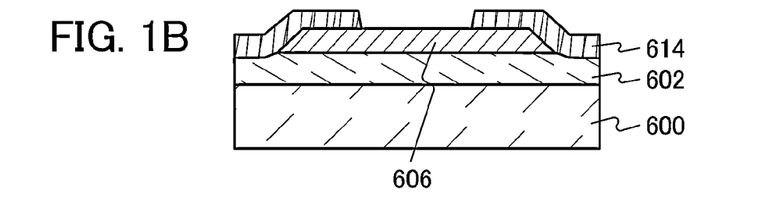

Next, a metal film for forming electrodes functioning as a source electrode layer and a drain electrode layer is formed. The metal film can be formed with a single-layer structure or a stacked structure using a metal material such as molybdenum, titanium, tantalum, tungsten, aluminum, copper, chromium, neodymium, or scandium or an alloy material containing any of these materials as its main component.

In this embodiment, a 50-nm-thick tungsten film with a single-layer structure is formed. The tungsten film is formed using a sputtering apparatus with a power of 1000 W (DC) in an argon atmosphere. Note that the substrate temperature in the film formation is set at 200° C.

Next, the tungsten film is processed by a second photolithography process to form a pair of electrodes 614 (see FIG. 1B).

In this embodiment, the tungsten film is dry-etched. As the etching gasses, $CF_4$, $Cl_2$, and $O_2$ are used.

In this embodiment, etching conditions for dry-etching the 15-nm-thick In—Sn—Zn—O film as little as possible and only the tungsten film are as follows: the amount of power applied to a coil-shaped electrode is 500 W; the amount of bias power applied to the substrate 600 side is 150 W (RF); the flow rates of $CF_4$ gas, $Cl_2$ gas, and $O_2$ gas introduced into the etching apparatus are 25 sccm, 10 sccm, and 10 sccm, respectively; the pressure is 1.0 Pa; and the substrate temperature is 70° C. The time for etching may be determined in consideration of the etching rate and the thickness of the tungsten film. The etching rate of the tungsten film under these etching conditions is 184.4 nm/min. The etching rate of the In—Sn—Zn—O film under these etching conditions is 15.9 nm/min. The selectivity of the In—Sn—Zn—O film to the tungsten film is high and thus, only the tungsten film can be etched.

Note that the etching rate of the In—Sn—Zn—O film is different from that of the In—Ga—Zn—O film, and the In—Sn—Zn—O film is denser than the In—Ga—Zn—O film. Table 1 shows results of comparing etching rates in the first photolithography process (conditions for processing the film into an island shape) and in the second photolithography process (conditions for forming the pair of electrodes 614). The In—Ga—Zn—O film in Table 1 is formed using an In—Ga—Zn—O target of In:Ga:Zn=1:1:1 [atomic ratio] using a sputtering apparatus with a power of 500 W (DC) in a mixed atmosphere of argon:oxygen=2:1 [volume ratio] and a pressure of 0.6 Pa. The substrate temperature in the film formation is set at 300° C. The etching rate in Table 1 is measured in a sample which is not subjected to heat treatment after the formation of the In—Ga—Zn—O film.

TABLE 1

|  | IGZO ave[nm/min] | ITZO ave[nm/min] |
| --- | --- | --- |
| Conditions for processing the film into an island shape ($BCl_3/Cl_2$) | 38.2 | 24.1 |
| Conditions for forming the pair of electrodes (tungsten) ($CF_4/Cl_2/O_2$) | 22.4 | 15.9 |

Figure 1C:
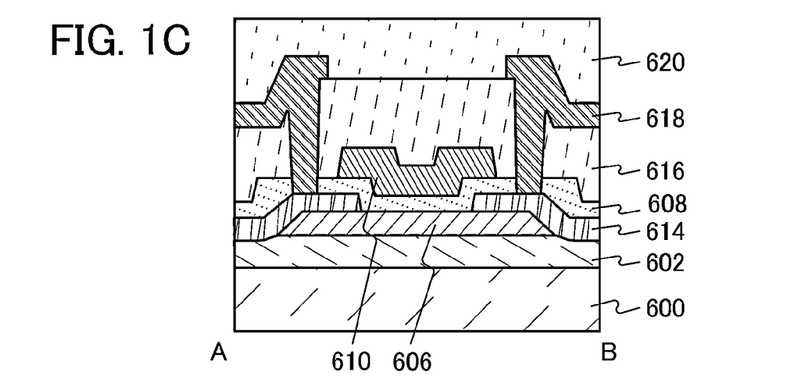

Next, a gate insulating layer 608 is formed to have a thickness greater than or equal to 1 nm and smaller than or equal to 200 nm. The gate insulating layer 608 can be formed by a sputtering method, an evaporation method, a PCVD method, a PLD method, an ALD method, an MBE method, or the like. In this embodiment, a 100-nm-thick silicon oxide film is formed by a sputtering method.

Next, a metal film for forming an electrode functioning as a gate electrode is formed. The metal film can be formed using a metal material such as molybdenum, titanium, tantalum, tungsten, aluminum, copper, chromium, neodymium, or scandium or an alloy material containing any of these materials as its main component. Alternatively, the gate electrode can be formed to have a stacked-layer structure and as one layer thereof, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film may be used. These films each have a work function of 5 eV or higher, preferably 5.5 eV or higher; thus, any of these films used for the gate electrode enables the threshold voltage of the transistor to be positive, so that a so-called normally-off switching element can be provided.

In this embodiment, the metal film has a stacked-layer structure in which a 135-nm-thick tungsten film is formed over a 15-nm-thick tantalum nitride film.

The tantalum nitride film is formed using a sputtering apparatus with a power of 1000 W (DC) in a mixed atmosphere of argon:nitrogen=5:1. The substrate is not heated in the formation of the tantalum nitride film. The tungsten film is formed using a sputtering apparatus with a power of 4000 W (DC) in an argon atmosphere. Note that the substrate temperature in the film formation is set at 200° C.

Next, the tantalum nitride film and the tungsten film are processed by a third photolithography process, so that a gate electrode 610 is formed.

Next, an interlayer insulating film 616 which covers the gate electrode 610 is formed. As the interlayer insulating film 616, an insulating film providing favorable step coverage is preferably used. The interlayer insulating film 616 can be formed using a silicon oxide film, a gallium oxide film, an aluminum oxide film, a silicon nitride film, a silicon oxynitride film, an aluminum oxynitride film, or a silicon nitride oxide film. In this embodiment, a silicon oxynitride film as the interlayer insulating film 616 is formed to have a thickness of 300 nm.

The silicon oxynitride film as the interlayer insulating film 616 is formed using a PCVD apparatus with a power of 35 W (RF) in a mixed atmosphere of monosilane:nitrous oxide=1: 200. Note that the substrate temperature in the film formation is set at 325° C.

Next, a contact hole is formed by processing the silicon oxynitride film by a fourth photolithography process.

Next, photosensitive polyimide for the second layer of the interlayer insulating film 616 is formed to have a thickness of 1500 nm.

Then, the photosensitive polyimide as part of the interlayer insulating film 616 is exposed to light with the use of a photomask which is used in the photolithography step on the silicon oxynitride film, and developed, and subjected to heat treatment for hardening the photosensitive polyimide film. In this manner, the interlayer insulating film 616 is formed together with the silicon oxynitride film and the photosensitive polyimide film. The heat treatment is performed in a nitrogen atmosphere at 300° C.

Next, a 50-nm-thick titanium film, a 100-nm-thick aluminum film, and a 5-nm-thick titanium film are stacked.

Then, the titanium film, the aluminum film, and the titanium film are processed by a fifth photolithography process, whereby wirings 618 electrically connected to the pair of electrodes 614 are formed.

Next, a photosensitive polyimide film to be part of a protective film 620 is formed to have a thickness of 1500 nm.

Next, the photosensitive polyimide film is exposed to light with the use of a photomask which is used in the photolithography process on the wiring 618, and developed to form the protective film 620 formed of the polyimide film in a region where the wiring is not provided, so that openings at which the wirings 618 are exposed are formed in the protective film 620.

Next, heat treatment for hardening the photosensitive polyimide film is performed thereon. The heat treatment is performed in a manner similar to the heat treatment performed on the photosensitive polyimide film as the interlayer insulating film 616.

Through the above process, the transistor having the structure shown in FIG. 1C can be manufactured.

Figure 1D:
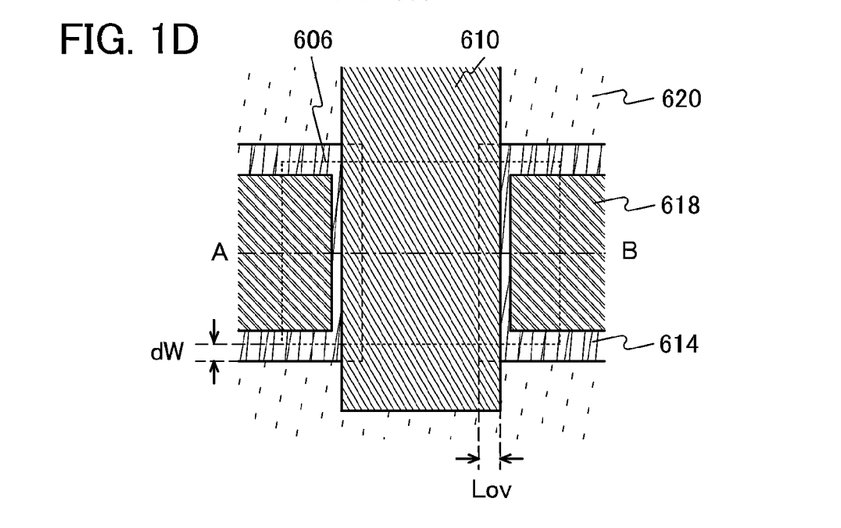

FIG. 1C is a cross-sectional view of the coplanar transistor having a top-gate top-contact structure. FIG. 1D is a top view of the transistor. Note that FIG. 1C is a cross-sectional view along dashed-dotted line A-B in FIG. 1D.

The transistor illustrated in FIG. 1C includes the substrate 600; the base insulating film 602 provided over the substrate 600; the oxide semiconductor layer 606 provided over the base insulating film 602; the pair of electrodes 614 in contact with the oxide semiconductor layer 606; the gate insulating layer 608 provided over the oxide semiconductor layer 606 and the pair of electrodes 614; the gate electrode 610 overlapping with the oxide semiconductor film 606 with the gate insulating layer 608 positioned therebetween; the interlayer insulating film 616 provided to cover the gate insulating layer 608 and the gate electrode 610; the wirings 618 electrically connected to the pair of electrodes 614 through the contact holes formed in the gate insulating layer 608 and the interlayer insulating film 616; and the protective film 620 provided to cover the interlayer insulating film 616 and the wirings 618.

Figure 2A:
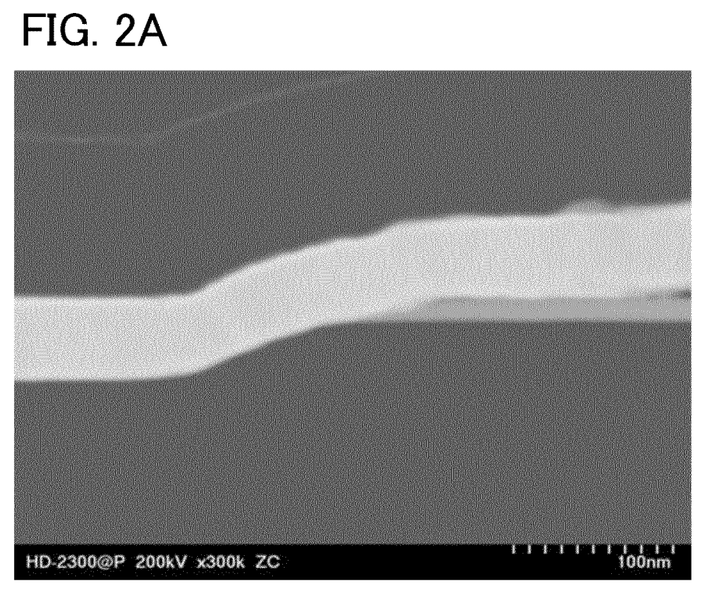
FIGS. 2A and 2B are a cross-sectional STEM image of a transistor and a schematic view thereof.
Figure 2B:
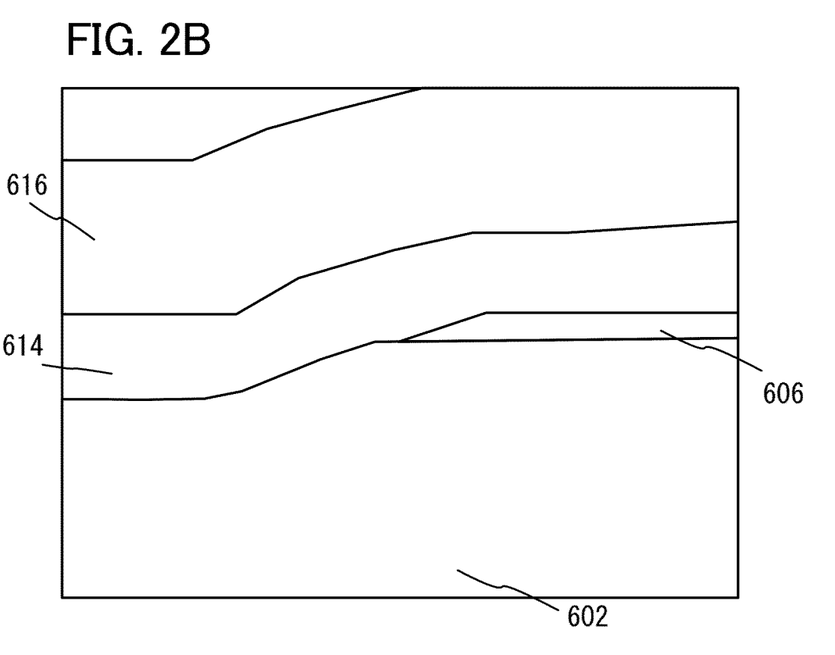

FIG. 2A is a cross-sectional STEM image in which a tapered end of an island-shaped layer and the periphery thereof are enlarged. FIG. 2B is a schematic view of FIG. 2A. The taper angle α is 16°.

Figure 3A:
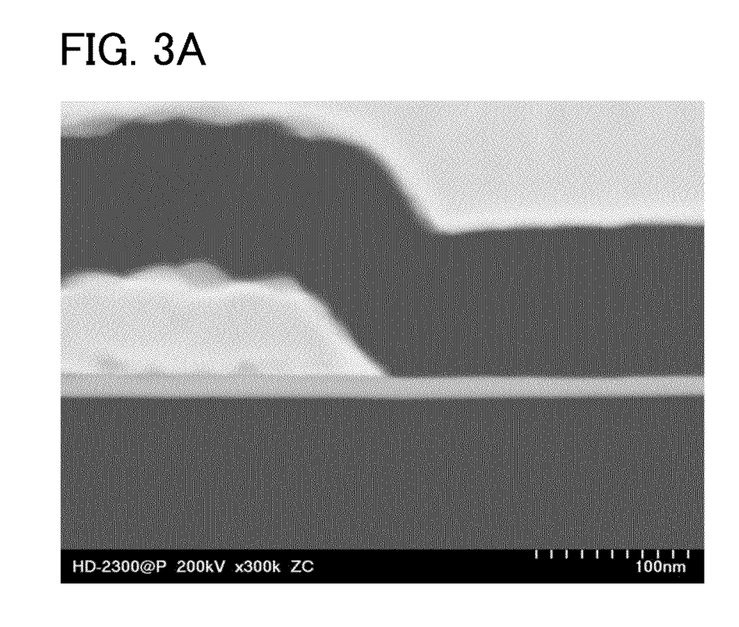
FIGS. 3A and 3B are a cross-sectional STEM image of a transistor and a schematic view thereof.
Figure 3B:
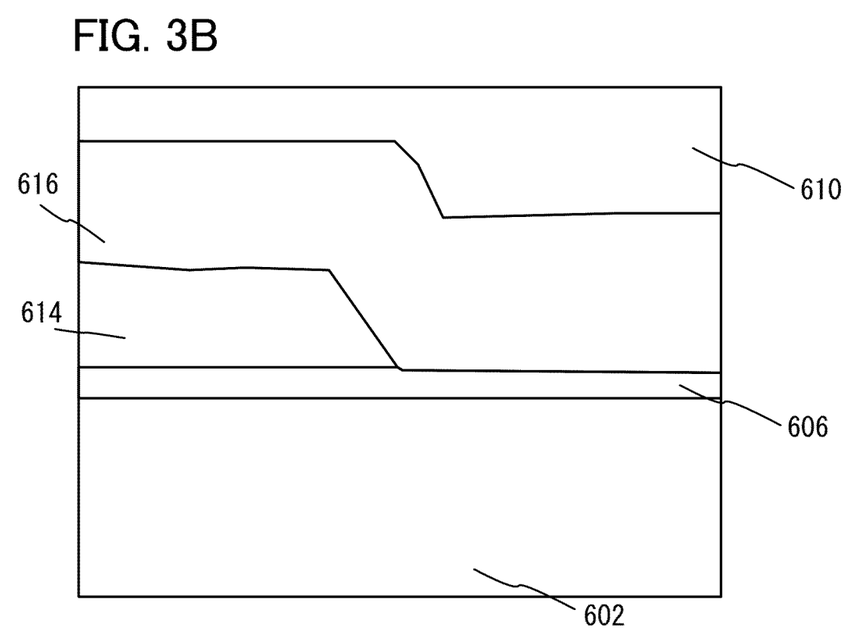

FIG. 3A is a cross-sectional STEM image in which a channel formation region of a transistor and the periphery thereof are enlarged. FIG. 3B is a schematic view of FIG. 3A. The thickness of the oxide semiconductor layer 606 in the channel formation region of the transistor is 13 nm to 13.7 nm. The thickness of a region where one of the pair of electrodes 614 overlaps with the oxide semiconductor layer 606 is 15 nm. Thus, the thickness difference between the two regions is about 2 nm to 1.3 nm, and there is a minute difference between the thicknesses of these two regions. This result shows that only the tungsten film is selectively etched in the second photolithography process.

Note that in the transistor having the structure illustrated in FIGS. 1C and 1D, the width of a portion where the gate electrode 610 overlaps with one of the pair of electrodes 614 is referred to as Lov. Similarly, the width of a portion of the pair of electrodes 614, which does not overlap with the oxide semiconductor layer 606, is referred to as dW.

In the case where heat treatment after the formation of the In—Sn—Zn—O film is 650° C. in the above manufacturing process, the field-effect mobility of the manufactured transistor is 39.9 cm$^2$/Vsec. Further, in the case where the In—Sn—Zn—O film is formed with the substrate heated at 200° C. and then heat treatment is not performed, the field-effect mobility of the manufactured transistor is 32.9 cm$^2$/Vsec. In the case where the In—Sn—Zn—O film is formed without the substrate heated and then heat treatment is not performed, the field-effect mobility of the manufactured transistor is 29.6 cm$^2$/Vsec. These results show that in order to improve the field-effect mobility of the transistor, it is important that a substrate is heated when an In—Sn—Zn—O film is formed and that heat treatment is performed after the In—Sn—Zn—O film is formed.

The base insulating film is planarized by planarization treatment so that the surface thereof can have an average surface roughness (Ra) of 1 nm or less, preferably 0.3 nm or less, further preferably 0.1 nm or less, so that the state of an interface between the base insulating film and the oxide semiconductor film is favorable, whereby the field-effect mobility can be increased and a variation in threshold voltages can be reduced in the manufactured transistor. Further, the substrate is heated and heat treatment is performed as described above, whereby off-state current can be 1 aA/μm or less.

In addition, the surface of the In—Sn—Zn—O film which is formed over the flat base insulating film is also flat. Further, since the In—Sn—Zn—O film is formed using a material which is hardly etched, the thickness thereof can be as small as about 5 nm; however, there is a problem that the material which is hardly etched is difficult to completely remove. When the thickness can be about 5 nm or less, the threshold voltage of the electrical characteristics of the transistor can be positive.

With the etching process described in this embodiment, the In—Sn—Zn—O film can be processed and the island-shaped In—Sn—Zn—O film can be tapered at the end, whereby the gate insulating layer and the like formed over the tapered film can be formed thin. Thus, the field-effect mobility can be improved.

In a transistor in which such an In—Sn—Zn—O film includes a channel formation region, a field-effect mobility of 30 cm$^2$/Vsec or higher, preferably 40 cm$^2$/Vsec or higher, further preferably 60 cm$^2$/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. With such characteristics, an integrated circuit having a novel function can be realized without decreasing the operation speed even when a transistor including an oxide semiconductor is also provided in an integrated circuit formed using a Si semiconductor.

The top-gate transistor is illustrated in FIGS. 1A to 1D as an example; however, the structure of the transistor is not limited thereto, and also in manufacture of a bottom-gate transistor, for example, the etching process of the In—Sn—Zn—O film can be employed.

Embodiment 2

In this embodiment, an example in which etching conditions in the second photolithography process are different from those in Embodiment 1 is described.

As in Embodiment 1, the base insulating film 602 is formed over the substrate 600, the oxide semiconductor layer 606 is formed over the base insulating film 602, and a tungsten film is formed over the oxide semiconductor layer 606. Further, the tungsten film is etched to form the pair of electrodes 614.

In the example of etching the tungsten film in this embodiment, the etching gassed are similar to those in Embodiment 1, the chamber size of the ICP etching apparatus is different from that in Embodiment 1, and the other etching conditions are different from that in Embodiment 1. As the etching gasses, $CF_4$, $Cl_2$, and $O_2$ are used.

In this embodiment, etching conditions for dry-etching the 15-nm-thick In—Sn—Zn—O film as little as possible and only the tungsten film are as follows: the amount of power applied to a coil-shaped electrode is 3000 W; the amount of bias power applied to the substrate 600 side is 110 W (RF); the flow rates of $CF_4$ gas, $Cl_2$ gas, and $O_2$ gas introduced into the etching apparatus are 55 sccm, 45 sccm, and 55 sccm, respectively; the pressure is 0.67 Pa; and the substrate temperature is 40° C. The time for etching may be determined in consideration of the etching rate and the thickness of the tungsten film. The etching rate of the tungsten film under these etching conditions is 280.2 nm/min. The etching rate of the In—Sn—Zn—O film under these etching conditions is 3.7 nm/min. The selectivity of the In—Sn—Zn—O film to the tungsten film is as high as 75.2 and thus, only the tungsten film can be etched.

Table 2 shows results of comparing the etching rates and the selectivity under the etching conditions in Embodiment 1 with the etching rates and the selectivity under the etching conditions in Embodiment 2, in the second photolithography process (conditions for forming the pair of electrodes 614).

TABLE 2

|  | W ave[nm/min] | ITZO ave[nm/min] | Selectivity W/ITZO |
|---|---|---|---|
| Conditions in Embodiment 1 | 184.4 | 15.9 | 11.6 |
| Conditions in Embodiment 2 | 280.2 | 3.7 | 75.2 |

From the etching rates, it can be said that the effective condition for increasing the selectivity of the In—Sn—Zn—O film to the tungsten film is that the flow rate of $Cl_2$ gas is high and the flow rate of $O_2$ gas is low. The selectivity of the In—Sn—Zn—O film to the tungsten film under the etching conditions described in this embodiment is about 6.5 times as high as that in Embodiment 1; thus, the thicknesses of the oxide semiconductor layer 606 in the channel formation region of the transistor between before and after the etching has little difference and can be kept at 15 nm.

Further, only the tungsten film can be dry-etched so as not to etch the In—Sn—Zn—O film and thus, the thickness of the In—Sn-An-O film used in the transistor can be less than 15 nm (e.g., 5 nm) in the film formation.

The remaining steps are performed in a manner similar to that in Embodiment 1 and thus a top-gate transistor can be manufactured.

The structure of the transistor in Embodiment 1 is a top-gate transistor, and the etching process disclosed in this embodiment is effective in manufacture of a bottom-gate transistor. For example, in the case where a channel-etched transistor is manufactured, a gate electrode is formed, a gate insulating layer is formed, an In—Sn—Zn—O-based oxide semiconductor layer is formed, and then a pair of electrodes serving as a source electrode layer and a drain electrode layer is formed using a tungsten film, over the oxide semiconductor layer. When the pair of electrodes is patterned, the oxide semiconductor layer is exposed and the exposed region serves as a channel formation region. At this time, when selectivity is low, the channel formation region is etched and part of the film is made thin. In the etching process disclosed in this embodiment, selectivity is as high as 75.2 and thus the channel formation region can be prevented from being etched. Accordingly, a variation in film thicknesses caused by etching of the channel formation region can be suppressed, so that transistors whose channel formation regions have uniform thicknesses can be manufactured over one substrate.

Embodiment 3

In this embodiment, an example in which at least part of a driver circuit and a transistor to be disposed in a pixel portion are formed over one substrate in a display device is described.

The transistor in the pixel portion is formed in accordance with Embodiment 1. Further, the transistor described in Embodiment 1 is an n-channel transistor, and thus part of a driver circuit that can be formed with n-channel transistors among driver circuits is formed over the same substrate as the transistor in the pixel portion.

Figure 4A:
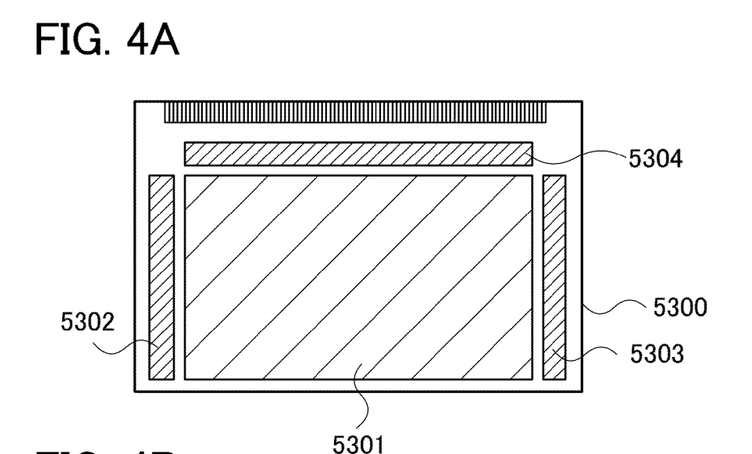
FIGS. 4A to 4C are a block diagram and equivalent circuit diagrams of one embodiment of the present invention.

FIG. 4A illustrates an example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are provided in a matrix in respective regions where the scan lines and the signal lines intersect with each other. Further, the substrate 5300 in the display device is connected to a timing control circuit (also referred to as a controller or a controller IC) through a connection point such as a flexible printed circuit (FPC).

In FIG. 4A, the first scan line driver circuit 5302, the second scan line driver circuit 5303, and the signal line driver circuit 5304 are formed over the substrate 5300 provided with the pixel portion 5301. Accordingly, the number of components of a drive circuit which is provided outside and the like are reduced, so that reduction in cost can be achieved. In addition, if the driver circuit is provided outside the substrate 5300, a wiring would need to be extended and the number of wiring connections would be increased; therefore, the driver circuit is provided over the substrate 5300, so that the number of connections of the wirings can be reduced. Accordingly, improvement in reliability and yield can be achieved.

Figure 4B:
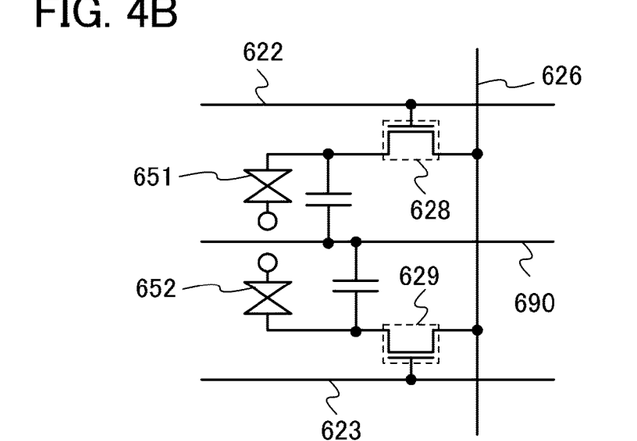

FIG. 4B illustrates an example of a circuit configuration of the pixel portion. Here, a pixel structure of a VA liquid crystal display panel is shown.

In this pixel structure, a plurality of pixel electrode layers are provided in one pixel, and transistors are connected to respective pixel electrode layers. The transistors are driven by different gate signals. In other words, signals applied to individual pixel electrode layers in a multi-domain pixel are controlled independently.

The gate wiring 622 of the transistor 628 and a gate wiring 623 of the transistor 629 are separated so that different gate signals can be given thereto. In contrast, a source or drain electrode layer 626 functioning as a data line is shared by the transistors 628 and 629. As each of the transistor 628 and the transistor 629, the transistor described in Embodiment 1 can be used as appropriate.

A first pixel electrode layer and a second pixel electrode layer have different shapes and are separated by a slit. The second pixel electrode layer is provided so as to surround the external side of the first pixel electrode layer which is spread in a V shape. Timing of voltage application is made to vary between the first and second pixel electrode layers by the transistors 628 and 629 in order to control alignment of the liquid crystal. The transistor 628 is connected to the gate wiring 622, and the transistor 629 is connected to the gate wiring 623. When different gate signals are supplied to the gate wiring 622 and the gate wiring 623, operation timings of the transistor 628 and the transistor 629 can be varied.

Further, a storage capacitor is formed using a capacitor wiring 690, a gate insulating layer as a dielectric, and a capacitor electrode electrically connected to the first pixel electrode layer or the second pixel electrode layer.

The first pixel electrode layer, a liquid crystal layer, and a counter electrode layer overlap with each other to form a first liquid crystal element 651. The second pixel electrode layer, a liquid crystal layer, and a counter electrode layer overlap with each other to form a second liquid crystal element 652. The pixel structure is a multi-domain structure in which the first liquid crystal element 651 and the second liquid crystal element 652 are provided in one pixel.

Note that a pixel structure of the present invention is not limited to the structure illustrated in FIG. 4B. For example, a switch, a resistor, a capacitor, a transistor, a sensor a logic circuit, or the like may be added to the pixel illustrated in FIG. 4B.

In this embodiment, an example of the VA liquid crystal display panel is shown; however, there is no particularly limitation, and the present invention can be applied to various modes of liquid crystal display devices. For example, as a method for improving viewing angle characteristics, one embodiment of the present invention can be applied to a lateral electric field mode (also referred to as an IPS mode) in which an electric field in the horizontal direction to the main surface of a substrate is applied to a liquid crystal layer.

For example, it is preferable to use liquid crystal exhibiting a blue phase for which an alignment film is not necessary for an IPS liquid crystal display panel. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed at 5 wt. % or more is used for a liquid crystal layer of a liquid crystal element in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence.

Further, in order to improve moving-image characteristics of a liquid crystal display device, a driving technique (e.g., a field sequential method) may be employed, in which a plurality of light-emitting diodes (LEDs) or a plurality of EL light sources is used as a backlight to form a surface light source, and each light source of the surface light source is independently driven in a pulsed manner in one frame period. As the surface light source, three or more kinds of LEDs may be used and an LED emitting white light may be used. In the case where three or more kinds of light sources emitting different colors (e.g., light sources of red (R), green (G), and blue (B)) are used as the surface light source, color display can be performed without a color filter. Further, in the case where an LED emitting white light is used as the surface light source, color display is performed with a color filter. Since a plurality of LEDs can be controlled independently, the light emission timing of LEDs can be synchronized with the timing at which a liquid crystal layer is optically modulated. By this driving technique, the LEDs can be partly turned off; therefore, particularly in the case of displaying a picture including a black display region in most of a screen, consumed power can be decreased.

Figure 4C:
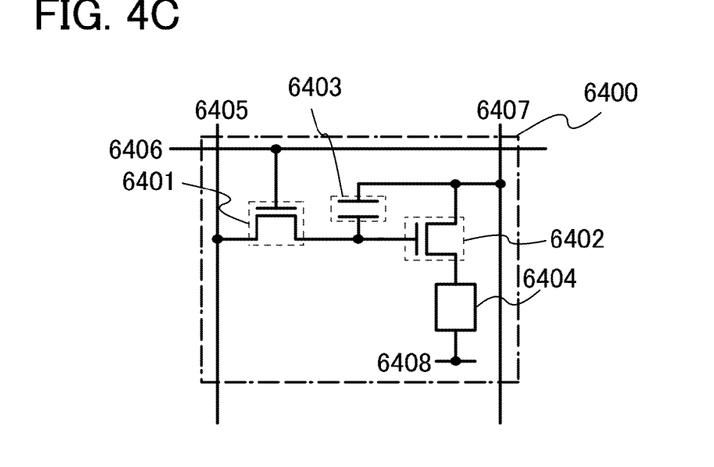

FIG. 4C shows another example of a circuit configuration of the pixel portion. Here, a pixel structure of a display panel using an organic EL element is shown.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 4C illustrates an example of a pixel structure as an example of a semiconductor device, which can be driven by a digital time grayscale method.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate electrode of the switching transistor 6401 is connected to a scan line 6406, a first electrode (one of a source electrode layer and a drain electrode layer) of the switching transistor 6401 is connected to a signal line 6405, and a second electrode (the other of the source electrode layer and the drain electrode layer) of the switching transistor 6401 is connected to a gate electrode of the driver transistor 6402. The gate electrode of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential which is lower than a high power supply potential when the high power supply potential that is set to the power supply line 6407 is a reference. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that the capacitor 6403 can be omitted by using gate capacitance of the driver transistor 6402. The gate capacitance of the driving transistor 6402 may be formed between the channel formation region and the gate electrode.

In the case of a voltage-input voltage-driving method, a video signal is input to the gate electrode of the driving transistor 6402 so that the driving transistor 6402 is in either of two states of being sufficiently turned on and turned off. That is, the driver transistor 6402 operates in a linear region. Since the driving transistor 6402 operates in a linear region, the voltage higher than the voltage of the power supply line 6407 is applied to the gate electrode of the driving transistor 6402. Note that a voltage higher than or equal to the voltage which is the sum of the power supply line and Vth of the driver transistor 6402 is applied to the signal line 6405.

In the case of performing analog grayscale driving instead of digital time grayscale driving, the same pixel configuration as FIG. 4C can be employed by changing signal input.

In the case of performing analog grayscale driving, a voltage greater than or equal to the sum of the forward voltage of the light-emitting element 6404 and Vth of the driving transistor 6402 is applied to the gate electrode of the driving transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

The pixel structure is not limited to that illustrated in FIG. 4C. For example, a switch, a resistor, a capacitor, a sensor, a transistor, a logic circuit, or the like may be added to the pixel illustrated in FIG. 4C.

Embodiment 4

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the transistor described in Embodiment 1 are described.

Figures 5A, 5B, 5C, 5D:
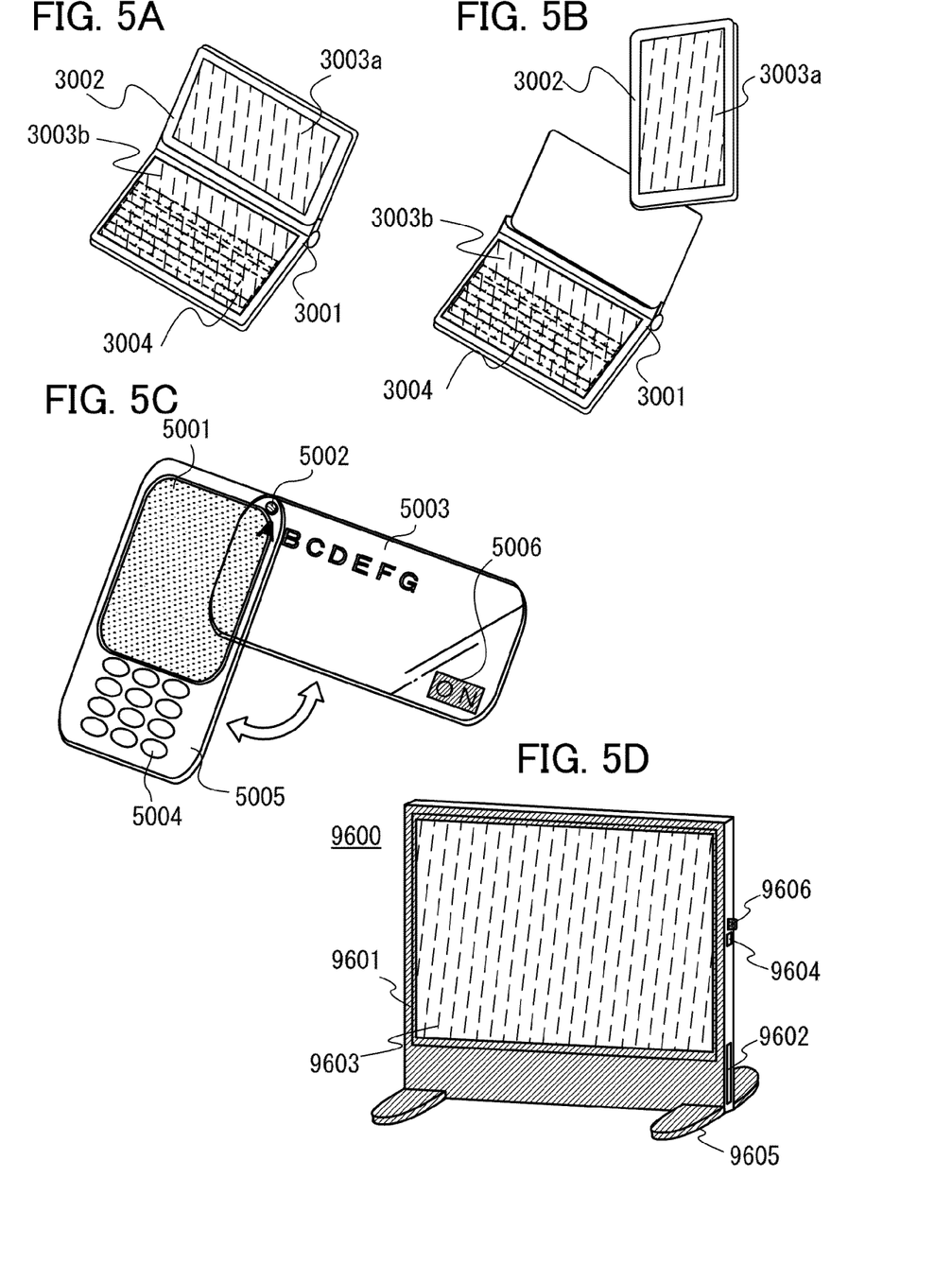
FIGS. 5A to 5D each illustrate one embodiment of an electronic device.

FIG. 5A illustrates a portable information terminal, which includes s main body 3001, a housing 3002, display portions 3003a and 3003b, and the like. The portable information terminal includes at least a battery, and preferably includes a memory for storing data (e.g., a flash memory circuit, an SRAM circuit, or a DRAM circuit), a central processing unit (CPU), or a logic circuit. When the transistor described in Embodiment 1 is used for the CPU, power consumption can be reduced.

The display portion 3003b functions as a touch panel. By touching a keyboard 3004 displayed on the display portion 3003b, a screen can be operated, and text can be input. Needless to say, the display portion 3003a may functions as a touch panel. A liquid crystal panel described in Embodiment 3 or an organic light-emitting panel is manufactured by using the transistor described in Embodiment 1 as a switching element and applied to the display portion 3003a or 3003b, whereby a portable information terminal can be provided.

The portable information terminal illustrated in FIG. 5A has a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 5A may transmit and receive data wirelessly. Through wireless communication, desired book data or the like can be purchased and downloaded from an electronic book server.

Further, in the portable information terminal illustrated in FIG. 5A, one of the two display portions, the display portion 3003a and the display portion 3003b, can be detached, the case of which is illustrated in FIG. 5B. The display portion 3003a also functions as a panel having a touch input function, and thus further reduction in weight of the portable information terminal of when it is carried can be achieved. The housing 3002 can be held by one hand and can operate by the other hand, which is convenient.

Furthermore, when the housing 3002 illustrated in FIG. 5B functions as an antenna, a microphone, or a wireless communication device, the housing 3002 may be used as a mobile phone handset.

FIG. 5C illustrates an example of a mobile phone handset. A mobile phone handset 5005 illustrated in FIG. 5C is provided with a display portion 5001 incorporated in a housing, a display panel 5003 attached to a hinge 5002, operation buttons 5004, a speaker, a microphone, and the like.

In the mobile phone handset 5005 illustrated in FIG. 5C, the display panel 5003 is slid to overlap the display portion 5001, and the display panel 5003 also functions as a cover having a light-transmitting property. The display panel 5003 is a display panel including the light-emitting element having a dual emission structure, in which light emission is extracted through the surface opposite to the substrate side and the surface on the substrate side.

Since the light-emitting element having a dual emission structure is used for the display panel 5003, display can be performed also with the display portion 5001 overlapped; therefore, both the display portion 5001 and the display panel 5003 can perform display and the users can view both the displays. The display panel 5003 has a light-transmitting property and the view beyond the display panel can be seen. For example, when a map is displayed on the display portion 5001 and the location points of users are displayed using the display panel 5003, the present location can be recognized easily.

Further, in the case where the mobile phone handset 5005 is provided with an image sensor to be used as a television telephone, it is possible to make conversation with plural persons while their faces are displayed; therefore, a television conference or the like can be performed. For example, when the face of a single person or the faces of plural persons are displayed on the display panel 5003 and further the face of another person is displayed on the display portion 5001, users can make conversation while viewing the faces of two or more persons.

When a touch input button 5006 displayed on the display panel 5003 is touched with a finger or the like, data can be inputted. Further, the user can make a call or compose an e-mail by sliding the display panel 5003 and touching the operation buttons 5004 with a finger or the like.

FIG. 5D illustrates an example of a television set. In a television set 9600, a display portion 9603 is incorporated in a housing 9601. The display portion 9603 can display images. Here, the housing 9601 is supported on a stand 9605 provided with a CPU. When the transistor described in Embodiment 1 is applied to the display portion 9603, the CPU, and the like, the television set 9600 with high reliability can be obtained.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Further, the television set 9600 is provided with an external connection terminal 9604, a storage medium recording and reproducing portion 9602, and an external memory slot. The external connection terminal 9604 can be connected to various types of cables such as a USB cable, and data communication with a personal computer is possible. A disk storage medium is inserted into the storage medium recording and reproducing portion 9602, and reading data stored in the storage medium and writing data to the storage medium can be performed. In addition, a picture, a video, or the like stored as data in an external memory 9606 inserted to the external memory slot can be displayed on the display portion 9603.

The methods and structures described in this embodiment can be combined as appropriate with any of the methods and structures described in the other embodiments.

This application is based on Japanese Patent Application serial no. 2011-108666 filed with Japan Patent Office on May 13, 2011, the entire contents of which are hereby incorporated by reference.

What is claimed is:

1. A method for manufacturing a semiconductor device comprising the steps of:
    forming an oxide semiconductor layer over an oxide insulating layer;
    performing a heat treatment of the oxide semiconductor layer in an inert atmosphere and then in an oxidation atmosphere by switching the inert atmosphere to the oxidation atmosphere with a temperature of the heat treatment maintained; and
    selectively removing the oxide semiconductor layer by dry etching using a gas containing chlorine so that part of the oxide insulating layer is exposed,
    wherein the oxide semiconductor layer comprises an In—Sn—Zn—O-based semiconductor layer, and
    wherein a thickness of an exposed region of the oxide insulating layer is smaller than a thickness of a region of the oxide insulating layer overlapped with the oxide semiconductor layer.

2. The method according to claim 1, wherein a taper angle of an end portion of the oxide semiconductor layer is greater than or equal to 10° and less than or equal to 70° after the dry etching.

3. The method according to claim 1, wherein a gas containing oxygen, a gas containing fluorine, a rare gas, or a hydrocarbon gas is used in the dry etching in addition to the gas containing chlorine.

4. The method according to claim 1, wherein the gas containing chlorine is $Cl_2$, $SiCl_4$, or $BCl_3$.

5. The method according to claim 1, wherein the oxide semiconductor layer is formed at a substrate temperature of 100° C. to 600° C. inclusive.

6. The method according to claim 1,
    wherein the inert atmosphere is a nitrogen atmosphere, and
    wherein the oxidation atmosphere is an oxygen atmosphere.

7. A method for manufacturing a semiconductor device comprising the steps of:
    forming an oxide semiconductor layer over an oxide insulating layer at a substrate temperature of 100° C. to 600° C. inclusive;
    performing a heat treatment of the oxide semiconductor layer in an inert atmosphere and then in an oxidation atmosphere by switching the inert atmosphere to the oxidation atmosphere with a temperature of the heat treatment maintained;
    selectively removing the oxide semiconductor layer by dry etching using a gas containing $Cl_2$ and $BCl_3$ so that part of the oxide insulating layer is exposed, wherein a thickness of an exposed region of the oxide insulating layer is smaller than a thickness of a region of the oxide insulating layer overlapped with the oxide semiconductor layer;
    forming a conductive layer over the oxide semiconductor layer;
    forming a source electrode layer and a drain electrode layer by processing the conductive layer, wherein the source electrode layer and the drain electrode layer overlap with an end portion having a taper angle of the oxide semiconductor layer;
    forming a gate insulating layer over the source electrode layer and the drain electrode layer; and
    forming a gate electrode over the gate insulating layer,
    wherein the oxide semiconductor layer comprises an In—Sn—Zn—O-based semiconductor layer, and
    wherein the taper angle of the end portion of the oxide semiconductor layer is greater than or equal to 10° and less than or equal to 70° after the dry etching.

8. The method according to claim 7, wherein a gas containing oxygen, a gas containing fluorine, a rare gas, or a hydrocarbon gas is used in the dry etching in addition to the gas containing $Cl_2$ and $BCl_3$.

9. The method according to claim 7, wherein dry etching or wet etching is used for processing the conductive layer to form the source electrode layer and the drain electrode layer.

10. The method according to claim 7,
    wherein the inert atmosphere is a nitrogen atmosphere, and
    wherein the oxidation atmosphere is an oxygen atmosphere.

11. A method for manufacturing a semiconductor device comprising the steps of:
    forming an oxide semiconductor layer over an oxide insulating layer;
    performing a heat treatment of the oxide semiconductor layer in an inert atmosphere and then in an oxidation atmosphere by switching the inert atmosphere to the oxidation atmosphere with a temperature of the heat treatment maintained;
    selectively removing the oxide semiconductor layer by a first dry etching with the use of a gas containing chlorine so that part of the oxide insulating layer is exposed, wherein a thickness of an exposed region of the oxide insulating layer is smaller than a thickness of a region of the oxide insulating layer overlapped with the oxide semiconductor layer;
    forming a conductive layer over the oxide semiconductor layer;
    processing the conductive layer by a second dry etching with the use of a gas containing fluorine, oxygen, and chlorine so that a source electrode layer and a drain electrode layer are formed, and so that part of the oxide semiconductor layer between the source electrode layer and the drain electrode layer is exposed, wherein the source electrode layer and the drain electrode layer overlap with an end portion having a taper angle of the oxide semiconductor layer;
    forming a gate insulating layer over the source electrode layer and the drain electrode layer; and
    forming a gate electrode over the gate insulating layer,
    wherein the oxide semiconductor layer comprises an In—Sn—Zn—O-based semiconductor layer,
    wherein the taper angle of the end portion of the oxide semiconductor layer is greater than or equal to 10° and less than or equal to 70° after the first dry etching, and
    wherein the part of the oxide semiconductor layer exposed by the second dry etching is thinner than a region overlapped with the source electrode layer and the drain electrode layer.

12. The method according to claim 11, wherein the oxide semiconductor layer is formed at a substrate temperature of 100° C. to 600° C. inclusive.

13. The method according to claim 11, wherein an inductively coupled plasma etching apparatus is used in the first dry etching and the second dry etching.

14. The method according to claim 11,
wherein the inert atmosphere is a nitrogen atmosphere, and
wherein the oxidation atmosphere is an oxygen atmosphere.

* * * * *